(12) United States Patent
Lin et al.

(10) Patent No.: US 7,776,755 B2
(45) Date of Patent: Aug. 17, 2010

(54) SOLUTION FOR POLYMER AND CAPPING LAYER REMOVING WITH WET DIPPING IN HK METAL GATE ETCHING PROCESS

(75) Inventors: Jr Jung Lin, Taichung (TW); Yih-Ann Lin, Jhudong Township, Hsinchu County (TW); Ryan Chia-Jen Chen, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 12/338,615

(22) Filed: Dec. 18, 2008

(65) Prior Publication Data

US 2010/0062590 A1 Mar. 11, 2010

Related U.S. Application Data

(60) Provisional application No. 61/094,751, filed on Sep. 5, 2008.

(51) Int. Cl.
*H01L 21/302* (2006.01)
*H01L 21/461* (2006.01)
*H01L 21/31* (2006.01)
*B08B 3/12* (2006.01)
*C25F 1/00* (2006.01)
*C25F 3/30* (2006.01)
*C25F 5/00* (2006.01)
*C11D 7/32* (2006.01)

(52) U.S. Cl. .............. 438/745; 438/704; 438/706; 438/749; 438/750; 438/759; 134/1.2; 510/175

(58) Field of Classification Search .......... 438/704, 438/706, 745, 749, 750, 759, 902; 134/1.2; 510/175

See application file for complete search history.

(56) References Cited

U.S. PATENT DOCUMENTS

| 5,908,509 | A  | * | 6/1999 | Olesen et al. ............ 134/1.3 |
| 6,099,662 | A  | * | 8/2000 | Wang et al. ............... 134/26 |
| 6,562,726 | B1 | * | 5/2003 | Torek et al. .............. 438/745 |
| 7,153,784 | B2 |   | 12/2006 | Braske et al. |
| 7,153,786 | B2 |   | 12/2006 | Kim et al. |
| 7,488,687 | B2 | * | 2/2009 | Park et al. ............... 438/700 |
| 2003/0219912 | A1 | * | 11/2003 | Chen et al. ................. 438/3 |
| 2003/0230786 | A1 | * | 12/2003 | Kim et al. ............... 257/506 |
| 2006/0054181 | A1 | * | 3/2006 | Rayandayan et al. ........ 134/1 |
| 2006/0160295 | A1 | * | 7/2006 | Kim et al. ............... 438/221 |
| 2007/0051700 | A1 | * | 3/2007 | Lee et al. ................ 216/83 |
| 2007/0190795 | A1 | * | 8/2007 | Zhuang et al. ........... 438/722 |
| 2008/0224238 | A1 | * | 9/2008 | Kanakasabapathy et al. ..... 257/411 |
| 2009/0004870 | A1 | * | 1/2009 | Liu et al. ............... 438/710 |
| 2009/0194876 | A1 | * | 8/2009 | Yang et al. .............. 257/751 |

* cited by examiner

*Primary Examiner*—Ha Tran T Nguyen
*Assistant Examiner*—Karen M Kusumakar
(74) *Attorney, Agent, or Firm*—Haynes and Boone, LLP

(57) ABSTRACT

The present disclosure provides a method for making metal gate stacks of a semiconductor device. The method includes applying a first etching process to the substrate to remove a polysilicon layer and a metal gate layer on the substrate; applying a diluted hydrofluoric acid (HF) to the substrate to remove polymeric residue; thereafter applying to the substrate with a cleaning solution including hydrochloride (HCl), hydrogen peroxide (H2O2) and water (H2O); applying a wet etching process diluted hydrochloride (HCl) to the substrate to remove a capping layer; and applying to the substrate with a second etching process to remove a high k dielectric material layer.

20 Claims, 3 Drawing Sheets

SOLUTION FOR POLYMER AND CAPPING LAYER REMOVING WITH WET DIPPING IN HK METAL GATE ETCHING PROCESS

PRIORITY DATA

This application claims priority to Provisional Application Ser. No. 61/094,751 filed on Sep. 5, 2008, entitled "A NOVEL SOLUTION FOR POLYMER AND CAPPING LAYER REMOVING WITH WET DIPPING IN HK METAL GATE ETCHING PROCESS," the entire disclosure of which is incorporated herein by reference.

BACKGROUND

In advanced technology nodes of integrated circuit industry, high k dielectric material and metal are adopted to form a gate stack of a field-effect transistor (FET) such as a metal-oxide-semiconductor field-effect transistors (MOSFETs). In a method to form a metal gate stack, various dry and wet etching processes are implemented. For example, when a capping layer interposed between the high k dielectric material layer and the metal gate layer, the existing etching process generates heavy polymeric residue, which is difficult to remove. In addition, the capping layer itself is difficult to remove.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

Figure 1:
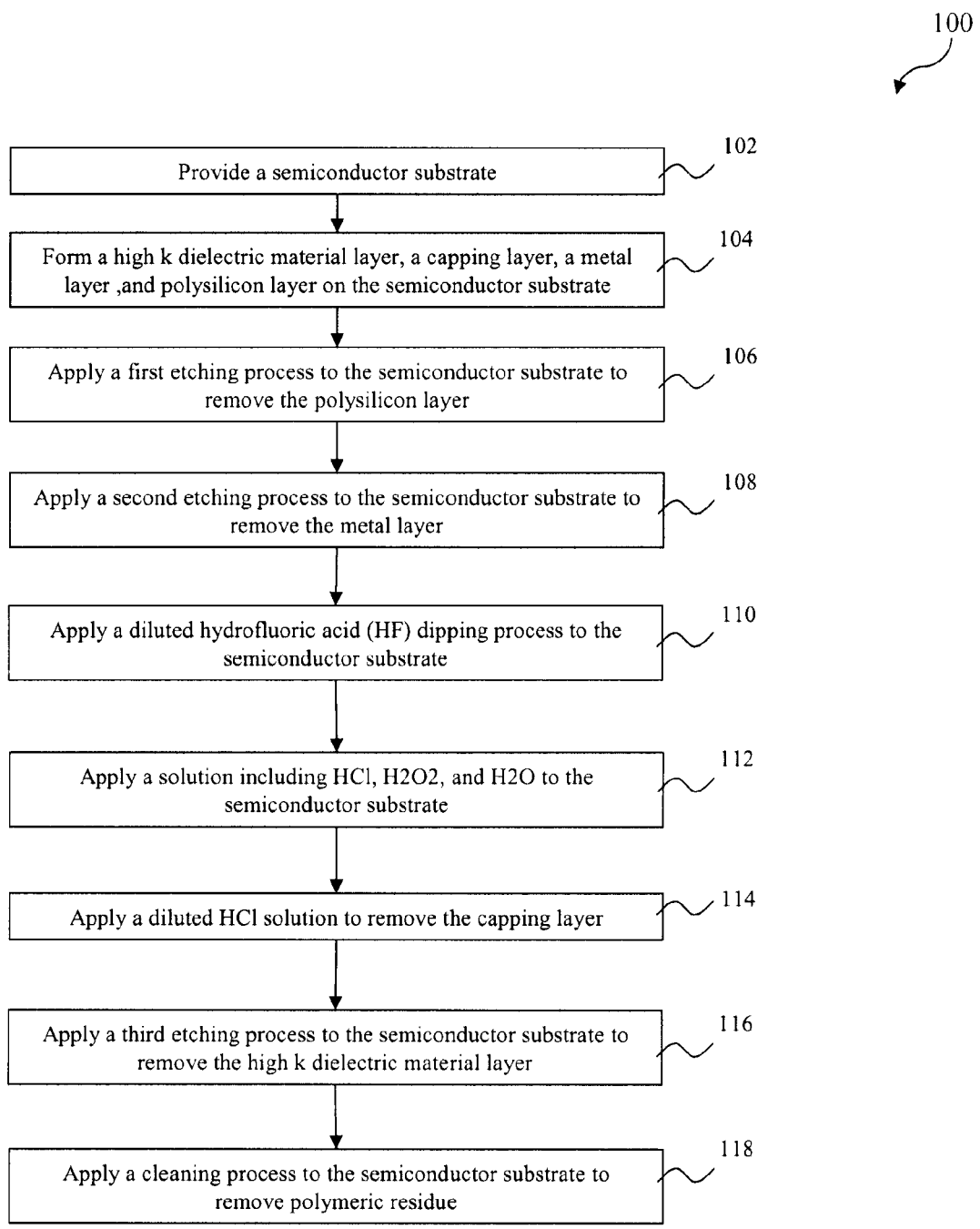
FIG. 1 is a flowchart of a method for making a semiconductor device having a metal gate stack in one embodiment constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
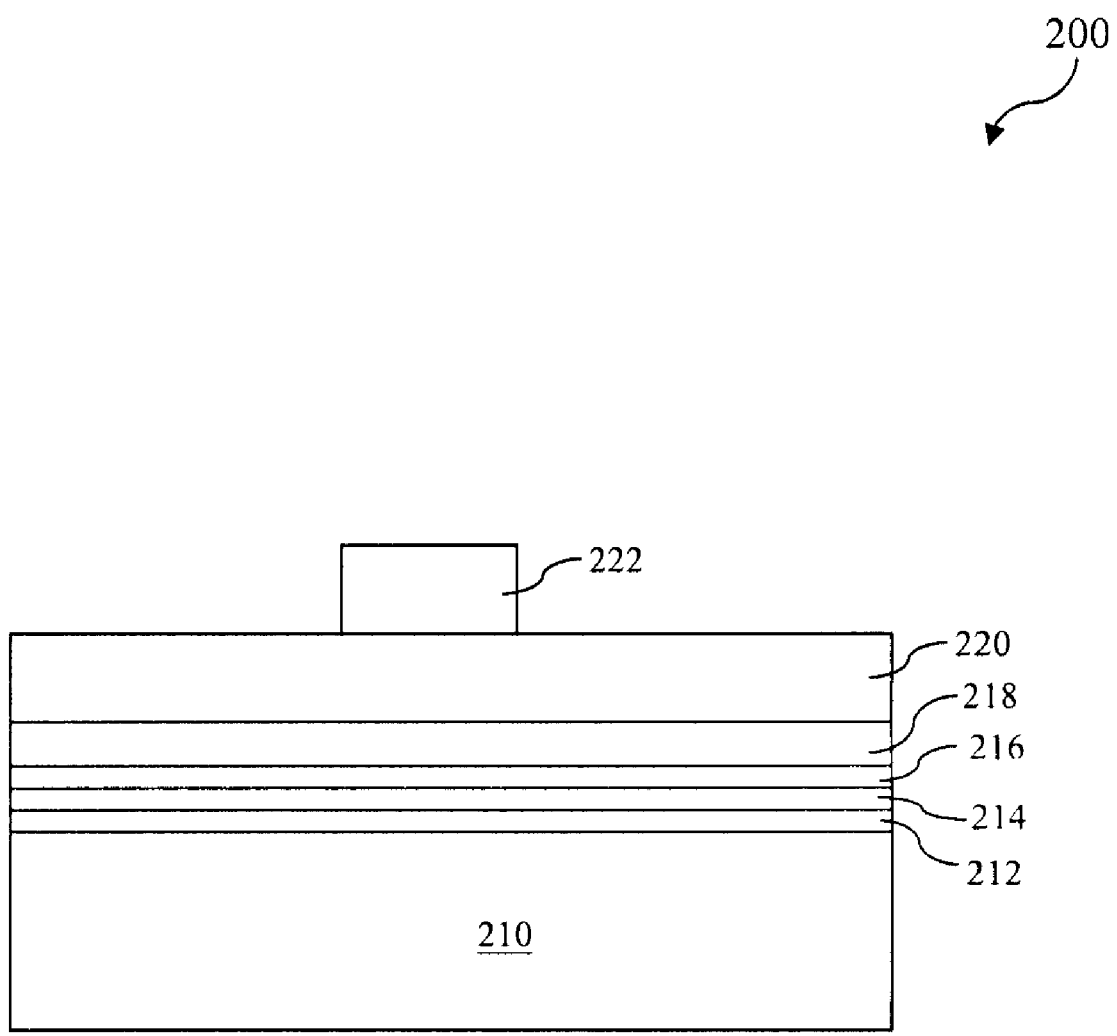
FIGS. 2 and 3 are sectional views of one embodiment of a semiconductor device having a metal gate stack at various fabrication stages constructed according to various aspects of the present disclosure.
Figure 3:
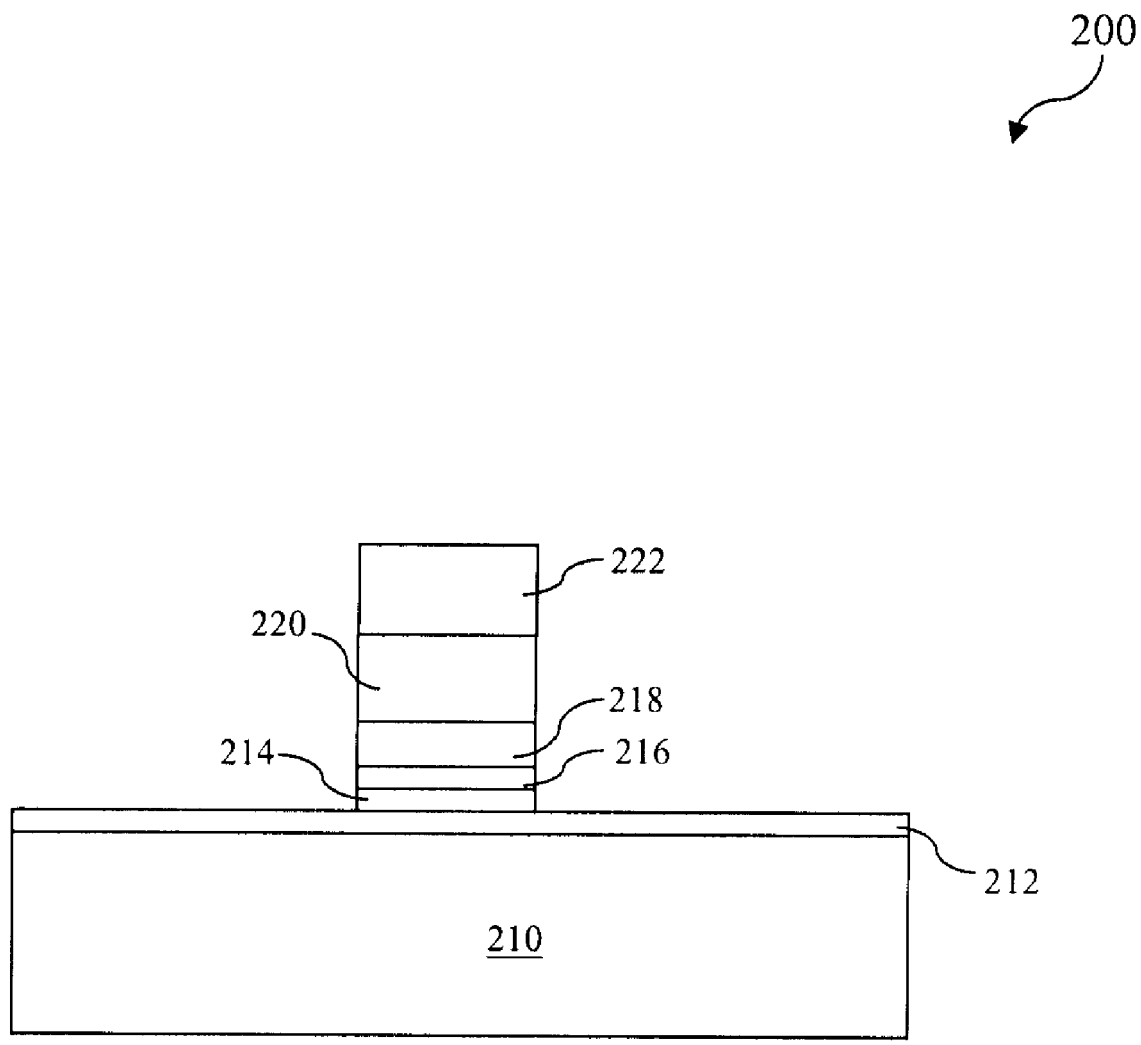

FIG. 1 is a flowchart of one embodiment of a method 100 making a semiconductor device having a metal gate stack constructed according to aspects of the present disclosure. FIGS. 2 and 3 are sectional views of one embodiment of a semiconductor structure 200 having a metal gate stack at various fabrication stages. The method 100 of making a semiconductor device is described with reference to FIGS. 1 through 3.

The method 100 begins at step 102 by providing a semiconductor substrate 210. The semiconductor substrate 210 includes silicon. Alternatively, the substrate 210 includes germanium or silicon germanium. In other embodiments, the substrate 210 may use another semiconductor material such as diamond, silicon carbide, gallium arsenic, GaAsP, AlInAs, AlGaAs, GaInP, or other proper combination thereof.

The method 100 proceeds to step 104 by forming various metal-gate-stack material layers on the semiconductor substrate 210. In one embodiment, a high k dielectric material layer 214 is formed on the semiconductor substrate 210. A capping layer 216 is formed on the high k dielectric material layer 214. A metal gate layer (metal layer) 218 is formed on the capping layer 216. A polysilicon layer 220 is additionally formed on the metal layer 218. An interfacial layer (IL) 212 may be interposed between the semiconductor substrate 210 and the high k dielectric material layer 214.

The high k dielectric material layer 214 is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material layer includes metal nitrides, metal silicates or other metal oxides.

The metal gate layer 218 is formed by PVD or other suitable process. The metal gate layer 218 includes titanium nitride. In another embodiment, the metal gate layer may include tantalum nitride, molybdenum nitride, tungsten nitride, tungsten, tantalum carbide, tantalum carbide nitride or titanium aluminum nitride.

The capping layer 216 is interposed between the high k dielectric material layer 214 and the metal gate layer 218. The capping layer 216 includes lanthanum oxide (LaO). The capping layer may alternatively include other suitable materials.

The interfacial layer 212, such as a thin silicon oxide layer, is formed on the silicon substrate 210 before forming the high k dielectric material layer 214. The thin silicon oxide layer may be formed by atomic layer deposition (ALD) or thermal oxidation.

A patterned mask 222 is formed on the multiple metal-gate-stack layers and is used as a mask to form metal gates. The patterned mask 222 is formed on the polysilicon layer 220 as illustrated in FIG. 2. In one embodiment, the patterned mask layer 222 include a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint.

In another embodiment, the patterned mask layer 222 includes a patterned hard mask layer. In one example, the patterned hard mask layer includes silicon nitride. As one example of forming the patterned silicon nitride hard mask, a silicon nitride layer is deposited on the polysilicon layer by a low pressure chemical vapor deposition (LPCVD) process. The precursor including dichlorosilane (DCS or $SiH_2Cl_2$), bis(TertiaryButylAmino)silane (BTBAS or C8H22N2Si) and disilane (DS or Si2H6) is used in the CVD process to form the silicon nitride layer. The silicon nitride layer is further patterned using a photolithography process to form a patterned photoresist layer and an etching process to etch the silicon nitride within the openings of the patterned photoresist layer. Alternatively, other dielectric material may be used as the patterned hard mask. For example, silicon oxynitride may be used as the hard mask.

The method proceeds to step 106 to pattern the polysilicon layer 220 by applying a first etching process, using the patterned mask 222 defining various gate regions and various openings exposing the gate stack material layers to be removed. The polysilicon layer within the openings of the patterned mask are removed by the first etching process. In one embodiment, the first etching process utilizes a dry etching process. In one example, the dry etching process implements a fluorine-containing plasma to remove the polysilicon. For example, the etch gas includes CF4. Alternatively, the polysilicon etch gas may include Cl2, HBr, O2 or combinations thereof.

The method proceeds to step 108 to pattern the metal gate layer 218 by applying a second etching process. The metal gate layer 218 within the openings of the patterned mask or patterned polysilicon layer are removed by the second etching process. In one embodiment, the second etching process utilizes a dry etching process. In one example, the dry etching process implements a fluorine-containing plasma to remove the metal gate layer. Particularly, the first dry etching process uses fluorocarbon plasma. For example, the etch gas includes CF4. Alternatively, the polysilicon and the metal gate layer are removed by a single etching process. For example, the single etching process utilizes a dry etching process with a fluorine-containing plasma to remove the polysilicon and the metal gate layer. Particularly, the single etching process uses fluorocarbon plasma, such as CF4.

The method proceeds to step 110 by applying a diluted hydrofluoric acid (HF) to the semiconductor structure 200. After the polysilicon/metal etching process(es), polymeric residues are formed on various surfaces including substrate and sidewalls of the patterned polysilicon and metal layer. For example, the polysilicon etch generates various polymeric residues including chlorine (Cl)-containing polymer, carbon (C)-containing polymer, fluorine (F)-containing polymer, HBr-containing polymer and/or silicon-containing polymer. In another example, the metal etch generates various polymeric residues including titanium (Ti)-containing polymer, chlorine (Cl)-containing polymer and/or HBr-containing polymer. A diluted HF dipping process applied after the polysilicon/metal etch can effectively remove the polymeric residues. In one embodiment, the diluted HF solution have a concentration as 500:1 representing for 500 part water and 1 part HF. In another embodiment, the diluted HF solution have a concentration between 500:1 and 100:1.

The method proceeds to step 112 by applying to the semiconductor structure 200 with a solution including hydrochloride (HCl), hydrogen peroxide (H2O2) and water (H2O). This solution is a standard cleaning chemical and is also referred to as SC2. The HF dipping process at the previous step 110 may generate other byproducts, such as LaF3. The SC2 dipping process can effectively clean the semiconductor structure 200 and remove the associated byproduct from the HF dipping. Additionally, the SC2 dipping process may also remove the oxidized portion of the capping layer.

The method proceeds to step 114 by applying to the semiconductor structure 200 with a diluted hydrochloride (HCl) solution to remove the capping layer. Alternatively, sulfuric acid (H2SO4) may be used to remove the LaO capping layer. In another embodiment, the diluted HF and diluted HCl may be combined in to one mixed solution. This mixed solution is then applied to the semiconductor substrate to remove the polymeric residues and the capping layer.

The method proceeds to step 116 to pattern the high k dielectric material layer 214 by applying a third etching process. The third etching process is tuned in terms of etchant and etching conditions to effectively remove the high k dielectric material layer. The high k dielectric material layer 214 within the openings of the patterned mask is substantially removed by the third etching process. In one embodiment, the third etching process includes a dry etch. In one example, the third etching process utilizes fluorine-containing plasma to remove the high k dielectric material layer. In other embodiments, the third dry etching process utilizes an etch chemistry including at least one of fluorine, chlorine and inert gas to remove the high k dielectric material layer.

The method may proceed to step 118 by applying a cleaning process to remove polymeric residue or other residue formed on the substrate and/or sidewalls of the metal gate stack. The cleaning etching process is designed to effectively remove the polymeric residue and other contamination. In one embodiment, the cleaning process is similar to the cleaning procedure applied after the polysilicon and metal patterning. For example, the cleaning process includes a diluted HF dipping process similar to that of step 110 and/or a SC2 dipping process similar to that of step 112. For another example, a SC1 solution including ammonium hydroxide (NH4OH) and peroxide (H2O2) is used at this cleaning process. In another example, a solution including sulfuric acid (H2SO4) and peroxide (H2O2) may be used at this cleaning process.

In this method, the HF dipping process, SC2 dipping process and HCl etching process are integrated to effectively remove the capping layer and polymeric residues. Therefore, the fabrication is implemented for effectiveness and high quality device result. Particularly, the disclosed method utilizes a diluted HF or SC2 to the semiconductor structure to effectively remove the capping layer such as lanthanum oxide (LaO) and the polymeric residue.

Although not shown, other processing step may present to form various doped regions such as source and drain regions, devices features such as multilayer interconnection (MLI). In one example, lightly doped drain (LDD) regions are formed after the formation of the gate stack. A gate spacer may be formed on the sidewalls of the metal gate stack. Then the source and drain regions are formed substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials.

The multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The semiconductor substrate may further include additional isolation features to isolate each from other devices. The isolation features may include different structures and can be formed using different processing technologies. For example, an isolation feature may include shallow trench isolation (STI) features. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The semiconductor structure 200 serves only as one example of a device within which various aspects of the method 100 may be implemented. The semiconductor structure 200 and the method 100 of making the same may be used in other semiconductor devices having a high k and metal gate features, such as strained semiconductor substrate, a hetero-semiconductor device or a stress-free isolation structure.

The present disclosure is not limited to applications in which the semiconductor structure includes a MOS transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor structure 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the capping layer can be aluminum oxide. The same procedure including HF dipping and SC2 dipping can be applied to remove polymeric residues. Then the HCl etch or H2SO4 etch may be applied to remove the capping layer. In one embodiment, the disclosed method is used to form an n-type metal-oxide-semiconductor field-effect-transistor (NMOSFET). In another embodiment, the disclosed method is used to form a metal gate stack in a gate-first process in which the metal gate stack is formed by the method 100 and remains in the final structure. In another embodiment, the disclosed method is used to form a metal gate stack in a hybrid process in which the first type metal gate stack (such as NMOS metal gate stack) is formed by the method 100 and remains in the final structure. The second type of the metal gate stack (such as PMOS metal gate stack) is formed as a dummy gate structure so that source/drain ion implantation processes and annealing processes can be implemented. Thereafter, a portion of the dummy gate stack is removed and the dummy gate trench is refilled with proper materials. For example, the polysilicon layer and metal layer in the PMOS region are removed. Then p metal is refilled and another metal such as copper is further filled in to form PMOS metal gate stack.

In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

Thus, the present disclosure provides a method for making metal gate stacks of a semiconductor device. The method includes applying a first etching process to the substrate to remove a polysilicon layer and a metal gate layer on the substrate; applying a diluted hydrofluoric acid (HF) to the substrate to remove polymeric residue; thereafter applying to the substrate with a cleaning solution including hydrochloride (HCl), hydrogen peroxide (H2O2) and water (H2O); applying a wet etching process diluted hydrochloride (HCl) to the substrate to remove a capping layer; and applying to the substrate with a second etching process to remove a high k dielectric material layer.

The disclosed method may further include applying a wet etching process to the semiconductor substrate to remove additional polymeric residue after the applying the second etching process. The capping layer includes lanthanum oxide (LaO) in one embodiment. The applying of the diluted HF may include implementing a HF solution with a concentration less than about 100:1 (100 part water:part HF). In another example, the diluted HCl includes a concentration of about 500:2. The semiconductor device may include a metal-oxide-semiconductor field-effect-transistor (MOSFET). The metal gate layer may include titanium nitride. The metal gate layer may include a conductive material selected from the group consisting of tantalum nitride (TaN), tantalum carbide (TaC), tantalum carbide nitride (TACN), molybdenum nitride (MoN), tungsten nitride (WN) and tungsten.

The present disclosure also provides another embodiment of a method for making metal gate stacks of a semiconductor device. The method includes forming various gate material layers on a substrate including a high k dielectric material layer, a capping layer on the high k dielectric material layer, a metal layer on the capping layer and a polysilicon layer on the metal layer; applying a first etching process to the substrate through openings of a patterned mask layer defining gate regions, removing the polysilicon layer and the metal gate layer from the openings; applying to the substrate with a solution including diluted hydrofluoric acid (HF) and hydrochloride (HCl) to remove polymeric residue and the capping layer; and thereafter applying to the substrate with a second etching process to remove the high k dielectric material layer.

In this method, the patterned mask layer may include a patterned photoresist layer. In another example, the patterned mask layer may include a patterned hard mask layer. The patterned hard mask layer may include silicon nitride.

The present disclosure also provides another embodiment of a method for making metal gate stacks of a semiconductor device. The method includes applying a first etching process to a substrate to remove a metal gate layer on the substrate; applying diluted hydrofluoric acid (HF) to the substrate to remove polymeric residue; thereafter applying to the substrate with a wet etching solution to remove a lanthanum oxide (LaO) layer; and applying to the substrate with a second etching process to remove a high k dielectric material layer.

In this method, the wet etching solution may include hydrochloride (HCl). The wet etching solution may include sulfuric acid (H2SO4). The method may further include applying a cleaning solution to the substrate before the applying of the wet etching solution and after the applying of the diluted HF. The cleaning solution may include HF, hydrogen peroxide (H2O2) and water (H2O). The metal layer may include titanium nitride (TiN). The applying of the first etching process may include implementing the first etching process to further remove a polysilicon layer disposed on the metal layer. The method may further include, before the applying of the first etching process, patterning a mask layer on the metal gate layer defining a gate region. The method may further include applying an additional HF wet etching process to the substrate after the second etching process. The metal gate stack is a metal gate structure of an N-type metal-oxide-semiconductor field-effect-transistor (NMOSFET) in one example.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making metal gate stacks of a semiconductor device comprising:
    applying a first etching process to a substrate to remove a polysilicon layer and a metal gate layer on the substrate;
    applying a diluted hydrofluoric acid (HF) to the substrate to remove polymeric residue;
    thereafter applying a cleaning solution to the substrate, the cleaning solution including hydrochloride (HCl), hydrogen peroxide (H2O2), and water (H2O);
    applying a wet etching process to the substrate to remove a capping layer, the wet etching process including diluted hydrochloride (HCl); and
    applying a second etching process to the substrate to remove a high k dielectric material layer.

2. The method of claim 1, further comprising applying another wet etching process to the substrate to remove additional polymeric residue after the applying the second etching process.

3. The method of claim 1, wherein the capping layer comprises lanthanum oxide (LaO).

4. The method of claim 1, wherein the applying the diluted HF comprises implementing an HF solution with a concentration less than about 100:1 (100 part water:1 part HF).

5. The method of claim 4, wherein the diluted HCl has a concentration of about 500:2.

6. The method of claim 1, wherein the metal gate layer comprises titanium nitride.

7. The method of claim 1, wherein the metal gate layer comprises a conductive material selected from the group consisting of tantalum nitride (TaN), tantalum carbide (TaC), tantalum carbide nitride (TACN), molybdenum nitride (MoN), tungsten nitride (WN) and tungsten.

8. A method for making metal gate stacks of a semiconductor device comprising:
    forming various gate material layers on a substrate including a high k dielectric material layer, a capping layer on the high k dielectric material layer, a metal layer on the capping layer, and a polysilicon layer on the metal layer;
    applying a first etching process to the substrate through openings of a patterned mask layer defining gate regions to remove the polysilicon layer and the metal gate layer from the openings;
    applying a solution to the substrate, the solution including diluted hydrofluoric acid (HF) and hydrochloride (HCl) to remove polymeric residue and the capping layer; and
    thereafter applying a second etching process to the substrate to remove the high k dielectric material layer.

9. The method of claim 8, wherein the patterned mask layer comprises a patterned photoresist layer.

10. The method of claim 8, wherein the patterned mask layer comprises a patterned hard mask layer.

11. The method of claim 10, wherein the patterned hard mask layer comprises silicon nitride.

12. A method for making metal gate stacks of a semiconductor device comprising:
    applying a first etching process to a substrate to remove a metal gate layer on the substrate;
    applying diluted hydrofluoric acid (HF) to the substrate to remove residues remaining from the first etching process;
    thereafter applying a wet etching solution to the substrate to remove a lanthanum oxide (LaO) layer; and
    applying a second etching process to the substrate to remove a high k dielectric material layer.

13. The method of claim 12, wherein the wet etching solution comprises hydrochloride (HCl).

14. The method of claim 12, wherein the wet etching solution comprises sulfuric acid (H2SO4).

15. The method of claim 12, further comprising applying a cleaning solution to the substrate before applying the wet etching solution and after applying the diluted HF.

16. The method of claim 15, wherein the cleaning solution comprises HF, hydrogen peroxide (H2O2), and water (H2O).

17. The method of claim 12, wherein the applying the first etching process comprises implementing the first etching process to further remove a polysilicon layer disposed on the metal layer.

18. The method of claim 12, further comprising, before applying the first etching process, patterning a mask layer on the metal gate layer to define a gate region.

19. The method of claim 12, further comprising applying an additional HF wet etching process to the substrate after the second etching process.

20. The method of claim 12, wherein the metal gate stack is a metal gate structure of an N-type metal-oxide-semiconductor field-effect-transistor (NMOSFET).

* * * * *